US008195324B2

(12) United States Patent
Tanaka et al.

(10) Patent No.: US 8,195,324 B2
(45) Date of Patent: Jun. 5, 2012

(54) PROBE POLISHING METHOD, PROGRAM THEREFOR, AND PROBE APPARATUS

(75) Inventors: Hideaki Tanaka, Nirasaki (JP); Satoshi Sano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 12/545,184

(22) Filed: Aug. 21, 2009

(65) Prior Publication Data

US 2010/0048099 A1    Feb. 25, 2010

(30) Foreign Application Priority Data

Aug. 25, 2008  (JP) ................................ 2008-216012

(51) Int. Cl.
*B24B 51/00* (2006.01)
*G06F 11/30* (2006.01)
*G06F 19/00* (2011.01)

(52) U.S. Cl. ............ 700/175; 700/108; 700/174; 451/5; 702/184

(58) Field of Classification Search .................. 700/108, 700/174, 175; 198/466.1, 468.1, 468.6, 494; 451/5, 8, 56

See application file for complete search history.

(56) References Cited

U.S. PATENT DOCUMENTS

| 5,741,171 | A  | * | 4/1998  | Sarfaty et al. ................ 451/6 |
| 5,791,973 | A  | * | 8/1998  | Nishio .......................... 451/41 |
| 5,904,608 | A  | * | 5/1999  | Watanabe ....................... 451/5 |
| 5,921,853 | A  | * | 7/1999  | Nishio .......................... 451/289 |
| 5,961,369 | A  | * | 10/1999 | Bartels et al. ................. 451/5 |
| 6,074,276 | A  | * | 6/2000  | Shibata et al. ................. 451/8 |
| 6,136,043 | A  | * | 10/2000 | Robinson et al. ............... 8/485 |
| 6,293,846 | B1 | * | 9/2001  | Oguri ........................... 451/6 |
| 6,650,408 | B2 | * | 11/2003 | Jun et al. ..................... 356/237.2 |
| 6,994,611 | B2 | * | 2/2006  | Svirchevski et al. ........... 451/56 |
| 7,027,640 | B2 | * | 4/2006  | Park et al. ..................... 382/152 |
| 7,072,034 | B2 | * | 7/2006  | Rosengaus et al. ............. 356/237.5 |
| 7,207,862 | B2 | * | 4/2007  | Nabeya et al. ................. 451/5 |
| 7,473,593 | B2 | * | 1/2009  | Anderson et al. ............... 438/197 |
| 2007/0077871 | A1 | * | 4/2007 | Park et al. ..................... 451/56 |

FOREIGN PATENT DOCUMENTS

JP    7-273159    10/1995

* cited by examiner

*Primary Examiner* — Albert Decady
*Assistant Examiner* — Jennifer L Norton
(74) *Attorney, Agent, or Firm* — Oblon, Spivak, McClelland, Maier & Neustadt, L.L.P.

(57) ABSTRACT

A probe polishing method is provided for polishing probes by brining a polishing member into slide-contact with probes through a mounting table having thereon the polishing member transferred from a first receiving part. The probe polishing method includes transferring the polishing member from the first receiving part to the mounting table; detecting a presence of foreign materials on a top surface of the polishing member mounted on the mounting table; transferring the polishing member from the mounting table to a second receiving part when the foreign materials are detected on the top surface of the polishing member; removing the foreign materials from the polishing member in the second receiving part; and transferring the polishing member from which the foreign materials are removed from the second receiving part to the first receiving part.

8 Claims, 5 Drawing Sheets

PROBE POLISHING METHOD, PROGRAM THEREFOR, AND PROBE APPARATUS

CROSS-REFERENCE TO RELATED APPLICATIONS

This application claims priority to Japanese Patent Application No. 2008-216012, filed on Aug. 25, 2008, the entire contents of which are hereby incorporated by reference.

FIELD OF THE INVENTION

The present invention relates to a method for polishing needle tips of probes of a probe card used to inspect electrical characteristics of an object to be inspected by using a polishing member, and more particularly, to a probe polishing method, a program therefor and a probe apparatus for automatically detecting foreign materials on a top surface of the polishing member and removing the foreign materials.

BACKGROUND OF THE INVENTION

A conventional probe apparatus includes a loader chamber and a prober chamber which are arranged adjacent to each other. The loader chamber has a cassette receiving part for receiving a cassette containing a plurality of objects to be inspected (e.g., semiconductor wafers W) therein, a wafer transfer mechanism for loading and unloading the wafers W into and from the cassette one by one and a pre-alignment mechanism for pre-aligning a semiconductor wafer. The prober chamber has a mounting table which is movable in X, Y, Z and θ directions while mounting thereon a semiconductor wafer, a probe card, which has probes, provided above the mounting table and an alignment mechanism for aligning the electrode pads of a semiconductor wafer with the probes.

The electrical characteristics of devices formed on a semiconductor wafer are inspected by bringing the probes into electrical contact with the electrode pads of a semiconductor wafer under the control of a control unit.

In performing the inspection, if necessary, one semiconductor wafer being inspected may be unloaded for sampling from a probe apparatus. In that case, the inspected semiconductor wafer is first transferred from the mounting table to, e.g., a wafer table provided below the cassette receiving part of the loader chamber, and then is unloaded from the wafer table. An example of the wafer table is disclosed in, e.g., Japanese Patent Laid-open Application No. H7-273159.

Further, when an inspection for electrical characteristics of the semiconductor wafer is performed, oxide films formed on surfaces of the electrode pads are scraped off to bring the probes of the probe card into electrical contact with the electrode pads of the semiconductor wafer and foreign materials, e.g., metal oxides thus generated during the contact are adhered to needle tips of the probes.

Figure 6A:
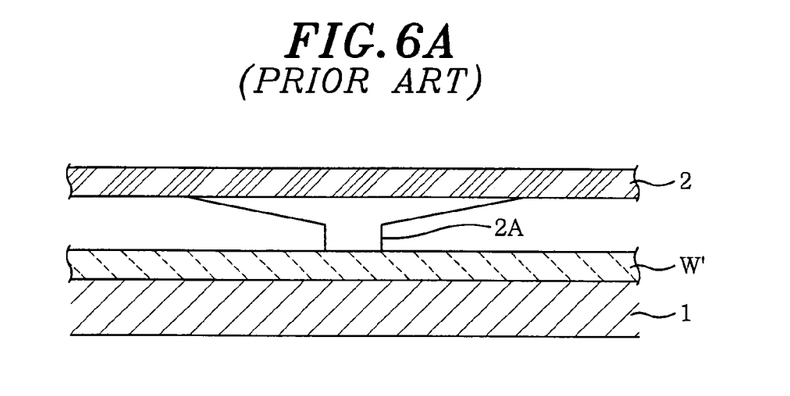
FIGS. 6A and 6B explain a conventional probe polishing method.
Figure 6B:
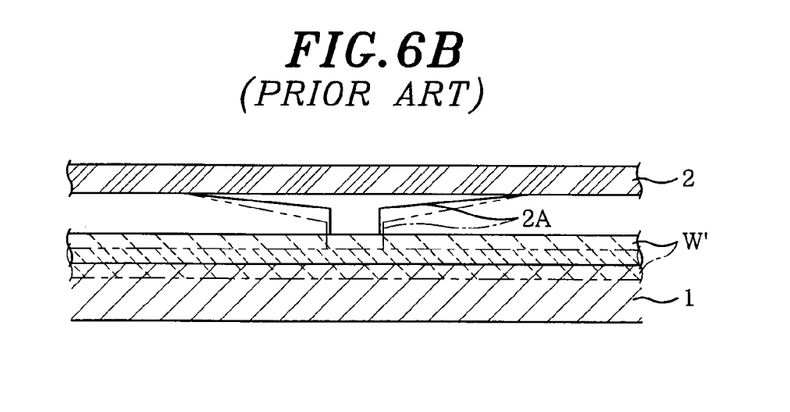

Conventionally, a polishing wafer W' is mounted on a mounting table 1 as shown in FIG. 6A, and then is brought into slide-contact with probes 2A of a probe card 2 by lifting the mounting table 1 slightly as illustrated in, e.g., FIG. 6B. Accordingly, the needle tips of the probes 2A are polished, and particles, e.g., metal oxides and the like can be removed from the probes 2A.

Meanwhile, due to a recent trend that a diameter of a semiconductor wafer becomes increased and a size of the probe card 2 becomes enlarged, the foreign materials of the probes 2A may have to be removed in the middle of the inspection. In this case, for example, a buffer table provided under the cassette receiving part of the loader chamber has the polishing wafer W' therein and, if necessary, the polishing wafer W' is unloaded from the buffer table and mounted on the mounting table 1 by a wafer transfer mechanism, so that the probes 2A are polished by the polishing wafer W' on the mounting table 1. After completing the polishing operation, the polishing wafer W' is returned from the mounting table to the buffer table by the wafer transfer mechanism. The above polishing operation is automatically carried out.

The foreign materials removed by polishing the probes 2A can be adhered to a top surface of the polishing wafer W'. However, it is not possible to check a presence of foreign materials on a top surface of the polishing wafer W' since the polishing operation of the probes 2A is automatically performed as described above. The foreign materials may also contain broken pieces from damaged parts of the probes 2A and the like. If a next polishing operation is performed with the foreign materials without being removed, the probes 2A may come into contact with the foreign materials and become bent, which leads to damages of the probe card. This may result in adverse influence on next inspection.

SUMMARY OF THE INVENTION

In view of the above, the present invention provides a probe polishing method, a program therefor and a probe apparatus, the method being provided for performing an inspection for electrical characteristics of an object to be inspected with no difficulty by automatically detecting foreign materials remaining on a top surface of a polishing member such as a polishing wafer while polishing probes and removing the foreign materials from the polishing member.

In accordance with a first aspect of the present invention, there is provided a probe polishing method performed by brining a polishing member into slide-contact with the probes through a mounting table having thereon the polishing member transferred from a first receiving part, the probe polishing method including: transferring the polishing member from the first receiving part to the mounting table; detecting a presence of foreign materials on a top surface of the polishing member mounted on the mounting table; transferring the polishing member from the mounting table to a second receiving part when the foreign materials are detected on the top surface of the polishing member; removing the foreign materials from the polishing member in the second receiving part; and transferring the polishing member from which the foreign materials are removed from the second receiving part to the first receiving part.

In accordance with a second aspect of the present invention, there is provided a probe polishing program for driving a computer to perform a probe polishing method performed by brining a polishing member into slide-contact with probes via a mounting table having thereon the polishing member transferred from a first receiving part, wherein the program is executed to perform: transferring the polishing member from the first receiving part to the mounting table; detecting a presence of foreign materials on a top surface of the polishing member mounted on the mounting table; transferring the polishing member from the mounting table to a second receiving part when the foreign materials are detected on the top surface of the polishing member; removing the foreign materials from the polishing member in the second receiving part; and transferring the polishing member from which the foreign materials are removed from the second receiving part to the first receiving part.

In accordance with a third aspect of the present invention, there is provided a probe apparatus including a movable mounting table for mounting thereon an object to be inspected; a probe card, which has a plurality of probes, provided above the mounting table, wherein particles adhered to the probes are removed from the probes by polishing the probes with the use of a polishing member mounted on the mounting table after performing an inspection for electrical characteristics of the object by bringing the probes into contact with electrode pads.

The probe apparatus comprises: a first receiving part for receiving a polishing member; an image pick-up unit for picking up an image of a top surface of the polishing member mounted on the mounting table; and a second receiving part for temporarily receiving the polishing member on which a presence of foreign materials is detected by the image pick-up unit.

In accordance with the present invention, it is possible to provide a probe polishing method, a program therefor and a probe apparatus that can securely inspect electrical characteristics of an object to be inspected by automatically detecting foreign materials remaining on a top surface of a polishing member such as a polishing wafer or the like during a polishing operation of probes and removing the foreign materials from the polishing member.

BRIEF DESCRIPTION OF THE DRAWINGS

The objects and features of the present invention will become apparent from the following description of embodiments, given in conjunction with the accompanying drawings, in which:

FIGS. 1A and 1B show a probe apparatus in accordance with an embodiment of the present invention, wherein

FIGS. 3A and 3B describe a part of the probe apparatus shown in FIGS. 1A and 1B, wherein FIG. 3A provides a cross sectional view illustrating a buffer table and a wafer table.

DETAILED DESCRIPTION OF THE EMBODIMENT

Embodiments of the present invention will be described with reference to FIGS. 1A to 5 which form a part hereof.

First of all, a probe apparatus of the present embodiment will be described. As illustrated in, e.g., FIGS. 1A and 1B, the probe apparatus 10 includes a loader chamber 11 for loading and unloading an object to be inspected W (e.g., a semiconductor wafer) and a prober chamber 12 for inspecting electrical characteristics of the semiconductor wafer W, the prober chamber 12 being adjacent to the loader chamber 11.

Figure 1A:
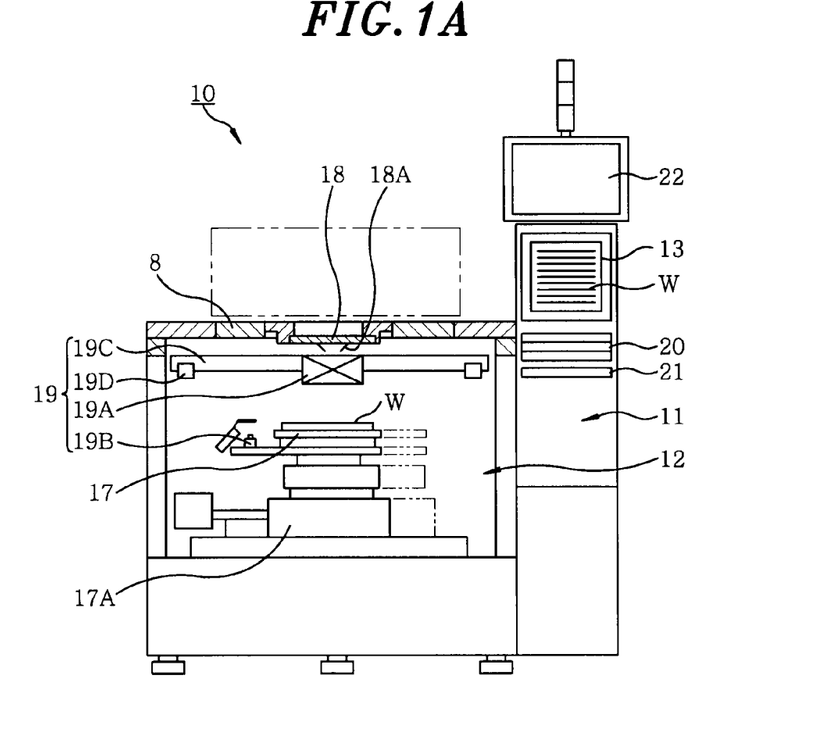
FIG. 1A is a cutaway front view of a prober chamber.
Figure 1B:
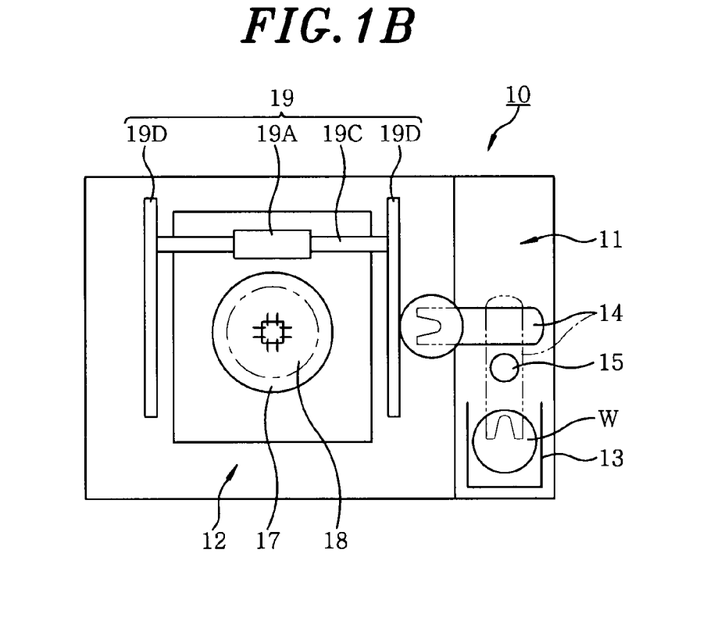
FIG. 1B is a top view showing an interior of the probe apparatus.

As shown in FIGS. 1A and 1B, the loader chamber 11 has a wafer receiving part 13 for receiving a cassette containing semiconductor wafers W therein, a wafer transfer mechanism 14 for transferring the semiconductor wafers W between the wafer receiving part 13 and the prober chamber 12, and a pre-alignment mechanism 15 for pre-aligning a semiconductor wafer W while transferring the semiconductor wafer W. The operation of devices such as the wafer transfer mechanism 14, the pre-alignment mechanism 15 and the like is controlled under the control of a control unit 16 (see FIG. 2).

The prober chamber 12 has a mounting table 17 for mounting thereon a semiconductor wafer W, a probe card 18, which has probes, disposed above the mounting table 17, and an alignment mechanism 19 for aligning electrode pads of the semiconductor wafer W with the probes 18A on the mounting table 17. The electrical characteristics of each device on the semiconductor wafer W are inspected after the alignment mechanism 19 is driven under the control of the control unit 16 to align the electrode pads of the devices of the semiconductor wafer W with the probes 18A of the probe card 18 in cooperation with the mounting table 17.

As can be seen from FIGS. 1A and 1B, the mounting table 17 includes a driving mechanism 17A having an XY table, an elevation mechanism and a θ mechanism, and is configured to move a semiconductor wafer W in X, Y, θ and vertical directions through the driving mechanism 17A. The alignment mechanism 19 has a first camera 19A moving between the mounting table 17 and the probe card 18, a second camera 19B installed at the side of the mounting table 17, an alignment bridge 19C to which the first camera 19A is fixed, and a pair of guide rails 19D for guiding movement of the alignment bridge 19C between an innermost side of the prober chamber 12 and a probe center (located on an extension line of a center of the probe card). The first camera 19A moves between the innermost side of the prober chamber and the probe center with the help of the alignment bridge 19C and the guide rails 19D to capture an image of a semiconductor wafer W on the mounting table 17 from the probe center while the mounting table 17 is moving in X and Y directions. The second camera 19B moves to a position directly below the probes 18A of the probe card 18 by moving the mounting table 17 in X and Y directions, and captures images of the probes 18A at that position.

Figure 2:
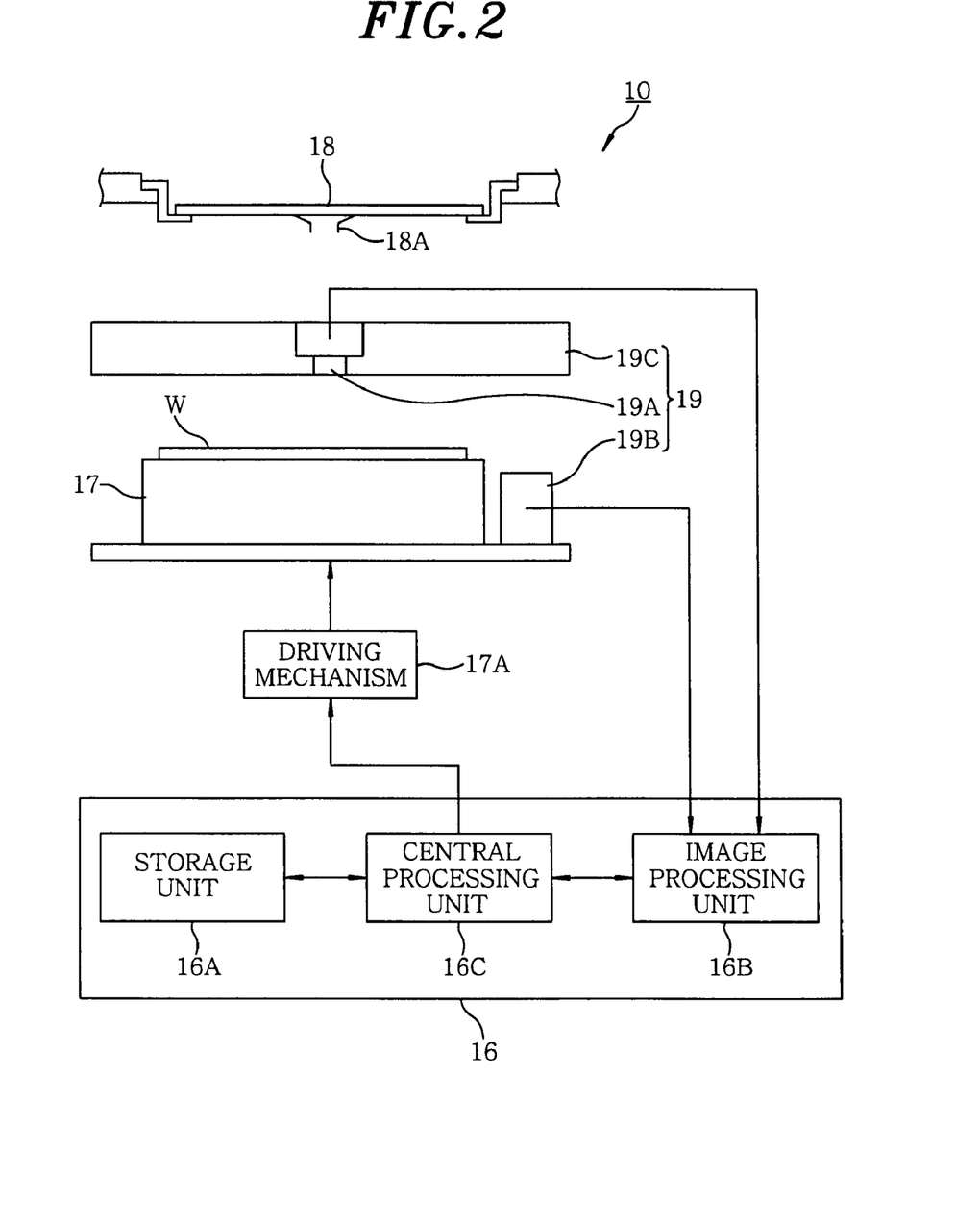
FIG. 2 illustrates the probe apparatus shown in FIGS. 1A and 1B.

Moreover, as shown in, e.g., FIG. 2, the control unit 16 mainly includes a computer having a storage unit 16A which stores therein a program for polishing probes in accordance with the present invention or other program and further stores therein various data, an image processing unit 16B which processes images based on image signals from the first and the second camera 19A and 19B, and a central processing unit 16C which transmits/receives various data to/from the storage unit 16A and the image processing unit 16B to execute operation processing. The probe polishing program or the like is read from the storage unit 16A so that various parts of the probe apparatus 10 such as the mounting table 17, the alignment mechanism 19 and the like can be controlled by the central processing unit 16C, or various data such as image data and/or numeric data as results of an inspection are processed by the central processing unit 16C depending on the purpose.

Moreover, when the semiconductor wafer W is inspected by using the probe apparatus 10, there can be difficulty in performing the inspection due to the adhesion of metal oxides and the like, which are scraped from the oxide film of the electrode pads, to the probes 18A of the probe card 18. Therefore, the particles adhered to the probes 18A, e.g., metal oxides are removed by polishing the probes 18A regularly or at proper times by using a polishing member (e.g., a polishing wafer W'). As shown in FIGS. 1A and 1B, the polishing wafer W' is held in the buffer table 20 provided below the wafer receiving part 13 of the loader chamber 11.

Figure 3A:
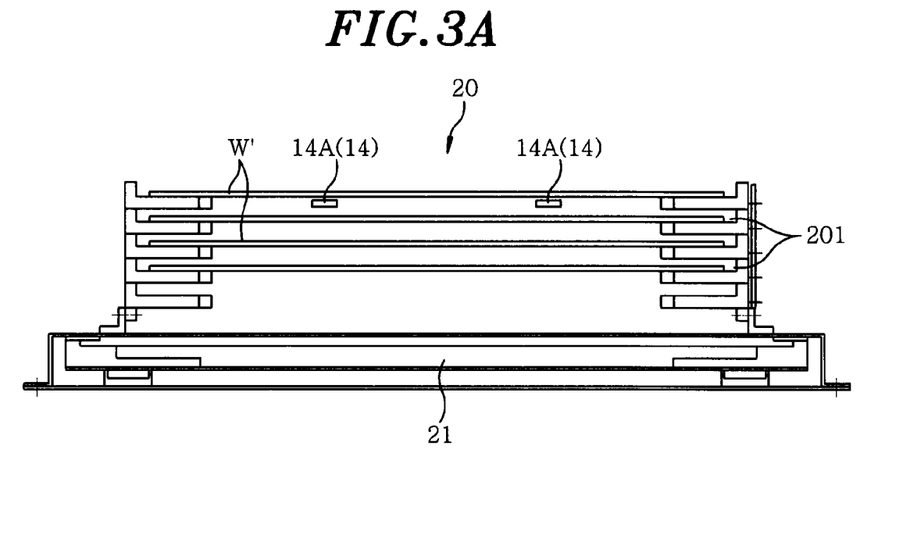
Figure 3B:
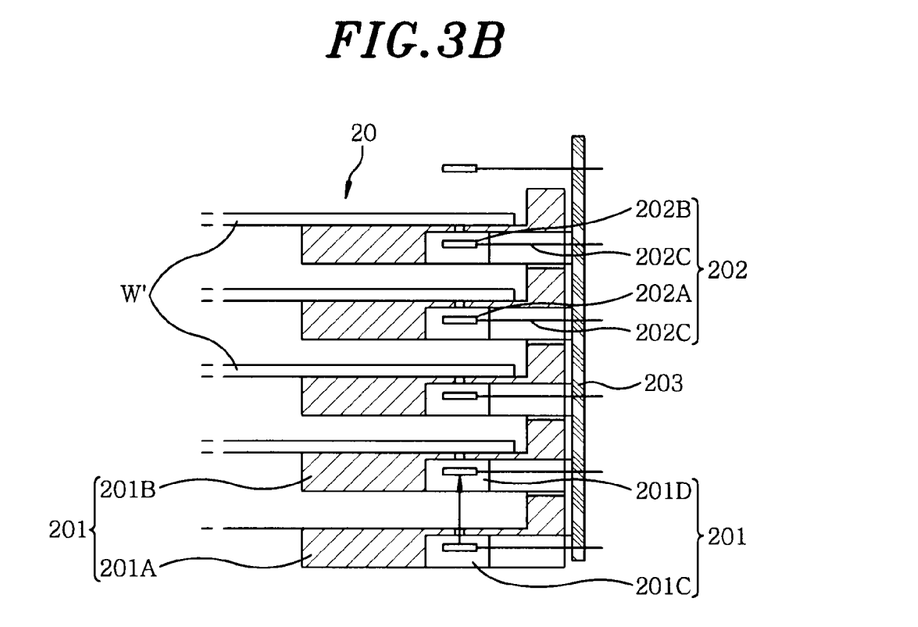
FIG. 3B is an enlarged cross sectional view of a part of the buffer table.

As depicted in FIGS. 3A and 3B, the buffer table 20 is provided with slots 201 spaced apart from each other at regular intervals in multiple stages in the vertical direction. The slots 201 can receive and hold a plurality of polishing wafers W' having the same diameter (e.g., about 300 mm φ). Accordingly, even if the number of devices considerably increases as the size of the semiconductor wafer W is increased so that the number of polishing operations of the probe card 18 increases, it can be coped with by using a plurality of polishing wafers W' consecutively.

Further, as shown in FIG. 3B, each of the slots 201 in the buffer table 20 is formed by an upper and a lower bracket 201A and 201B. Each of the slots 201 is provided with an optical sensor 202, which detects whether a polishing wafer W' exists or not. Thus, a presence of polishing wafers W' received in the slots 201 can be separately checked by optical sensors 202. Each of the optical sensors 202 has a light emitting element 202A and a light receiving element 202B which are mounted on a wiring substrate via respective wirings 202C. The lower bracket 201A has a space 201C for accommodating the light emitting element 202A, and the upper bracket 201B has a space 201D for accommodating the light receiving element 202B. Each of the optical sensors 202 is alternately arranged in every other slot 201 in a forward-backward direction of the slot 201 so that vertically adjacent optical sensors 202 are not overlapped with each other. For example, each of the optical sensors 202 is alternately arranged in every other slot 201 in a direction perpendicular to the plane of FIG. 3B.

Accordingly, a presence of a polishing wafer W' in one slot 201 is detected only by an optical sensor 202 provided with that slot 201, so that a presence of a polishing wafer W' in an upper slot 201 is not detected. In other words, light beams of vertically adjacent optical sensors 202 are not interfered with each other. Therefore, the polishing wafers W' in the slots 201 can be securely detected by the optical sensors 202 respectively provided with the slots 201. Referring to FIGS. 3A and 3B, it is shown that a polishing wafer W' is not disposed in a lowermost slot 201. In other words, when the light receiving element 202B receives a light signal from the light emitting element 202A as indicated by an arrow shown in FIG. 3B, it is detected that the polishing wafer W' is not disposed in the lowermost slot 201.

When a polishing wafer W' needs to be used, the polishing wafer W' is unloaded from the buffer table 20 by using the wafer transfer mechanism 14, and then is mounted on the mounting table 17. Next, the mounting table 17 moves to a position directly below the probe card 18, and the polishing wafer W' is brought into contact with the probes 18A. The probes 18A are polished by lifting the mounting table 17 while the polishing wafer W' is being in contact with the probes 18A, and then are cleaned by removing particles adhered to the probes 18A such as metal oxides and the like therefrom. After the polishing operation, the polishing wafer W' is returned from the mounting table 17 to the buffer table 20 by the wafer transfer mechanism 14. Moreover, when the probes 18A are polished, the entire surface of the polishing wafer W' can be uniformly used by properly changing the contact positions between the polishing wafer W' and the probes 18A.

However, when the probes 18A are polished by the polishing wafer W', metal oxides and the like removed from the probes 18A remain as foreign materials on the top surface of the polishing wafer W'. Further, in some cases, a part of the probes 18A may be damaged, and broken pieces of the probes 18A may also remain as foreign materials on the top surface of the polishing wafer W'. If a next polishing operation is carried out while the foreign materials remain on the top surface of the polishing wafer W, any one of the probes 18A may come into contact with the foreign materials, which causes the probes become bent or damaged, and hence, an inspection error can occur.

Therefore, in the present embodiment, the foreign materials remaining on the polishing wafer W' are automatically detected by capturing an image of the top surface of the polishing wafer W' with the use of the first camera 19A of the alignment mechanism 19, and thereafter the polishing wafer W' is transferred to a wafer table 21 to be described later by the wafer transfer mechanism 14 and is received in the wafer table 21. Next, the polishing wafer W' is unloaded from the wafer table 21 by an operator so that the foreign materials can be removed.

As shown in FIG. 3A, the wafer table 21 is provided below the buffer table 20, and is configured to be pulled in and out of the probe apparatus 10. In general, an inspected semiconductor wafer W is temporarily received in the wafer table 21, and then is unloaded from the probe apparatus 10 so that the wafer table 21 can be pulled out to thereby check an inspection result or the like. In the present embodiment, the wafer table 21 is used in order to remove the foreign materials of the polishing wafer W'. This wafer table 21 is provided with an optical sensor (not shown) of the same kind as that used in the buffer table 20. When the polishing wafer W' is received in the wafer table 21, it is notified by the optical sensor that the polishing wafer W' having foreign materials has been received.

In other words, in the present embodiment, the first camera 19A of the alignment mechanism 19 is used to automatically detect the foreign materials remaining on the top surface of the polishing wafer W' and, also, the wafer table 21 is used as a place for temporarily receiving the polishing wafer W' when the foreign materials needs to be removed from the polishing wafer W'.

Hereinafter, the probe polishing method in accordance with the embodiment of the present invention will be described. The probe polishing method of the present embodiment can be performed by using a program therefor in accordance with the present invention.

First of all, the probe polishing method of the present embodiment is carried out when the inspection for electrical characteristics of the semiconductor wafer W is repeated so that metal oxides and the like are adhered to the probes 18A of the probe card 18. The probe polishing method may be performed after a predetermined number of semiconductor wafers W are inspected or, if necessary, it may be performed while a semiconductor wafer W of a certain lot is being inspected.

In a step for performing the probe polishing method, when the computer is driven by the probe polishing program of the present embodiment, the central processing unit 16C of the control unit 16 executes the probe polishing method of the present embodiment in accordance with the probe polishing program read from the storage unit 16A. At that time, the wafer transfer mechanism 14 is driven under the control of the control unit 16 so that the semiconductor wafer W being inspected is transferred from the mounting table 17 in the prober chamber 12 to the original place of the wafer receiving part 13 in the loader chamber 11. Therefore, the semiconductor wafer W is removed from the mounting table 17.

Figure 4:
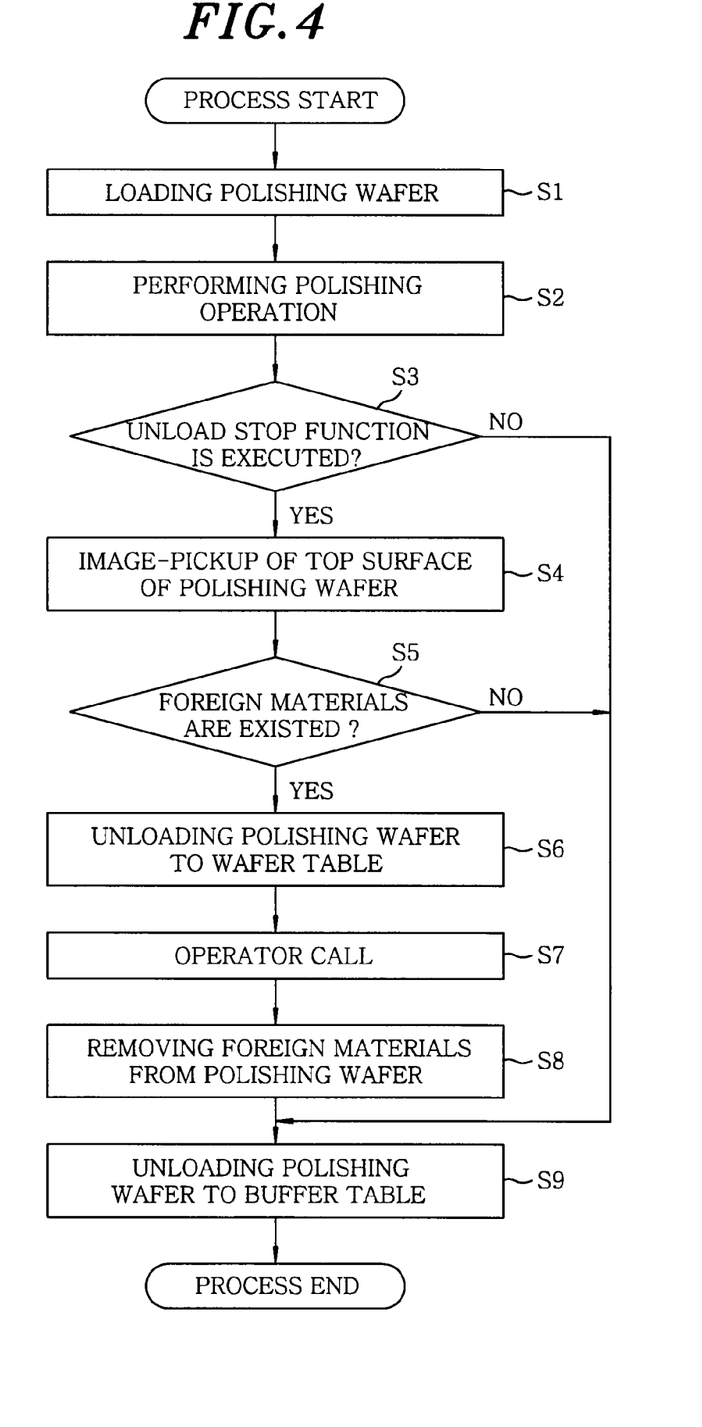
FIG. 4 presents a flowchart describing a probe polishing method in accordance with the embodiment of the present invention which uses the probe apparatus shown in FIGS. 1A to 2.

Next, as described in the flowchart shown in FIG. 4, when the process for polishing needle tips of the probes 18A is started, the wafer transfer mechanism 14 is driven to extend an arm 14A to a position directly below an uppermost polishing wafer W' in the buffer table 20 and the polishing wafer W' is withdrawn to be held on the arm 14A, as can be seen from FIG. 3A. Thereafter, the polishing wafer W' is unloaded from the buffer table 20 by the arm 14A of the wafer transfer mechanism 14, and then is transferred to and mounted on the mounting table 17 waiting in the prober chamber 12 (step S1).

When the polishing wafer W' is mounted on the mounting table 17, the polishing operation of the probes 18A of the probe card 18 is performed under the control of the control unit 16 (step S2). In other words, after the mounting table 17 moves to a position directly below the probe card 18, the polishing wafer W' is lifted so as to be in contact with the probes 18A. By lifting the mounting table 17 while the polishing wafer W' is being in contact with the probes 18A, the polishing wafer W' is brought into slide-contact with the probes 18A. Accordingly, the needle tips of the probes 18A are polished, and foreign materials O such as metal oxides and the like are removed from the probes 18A.

Upon completion of the cleaning of the probes 18A, the central processing unit 16C of the control unit 16 determines whether or not an unload stop function will be executed (step S3). Here, the unload stop function is a function that includes temporarily stopping the operation of returning the polishing wafer W' from the mounting table 17 to the buffer table 20 after polishing the needle tips of the probes 18A; checking the presence of foreign materials on the polishing wafer W'; and temporarily unloading the polishing wafer W' to the wafer table 21 when detecting foreign materials on the polishing wafer W'. The unload stop function can be set on a display screen 22 (see FIGS. 1A and 1B) of a display device of the probe apparatus 10.

Figure 5:
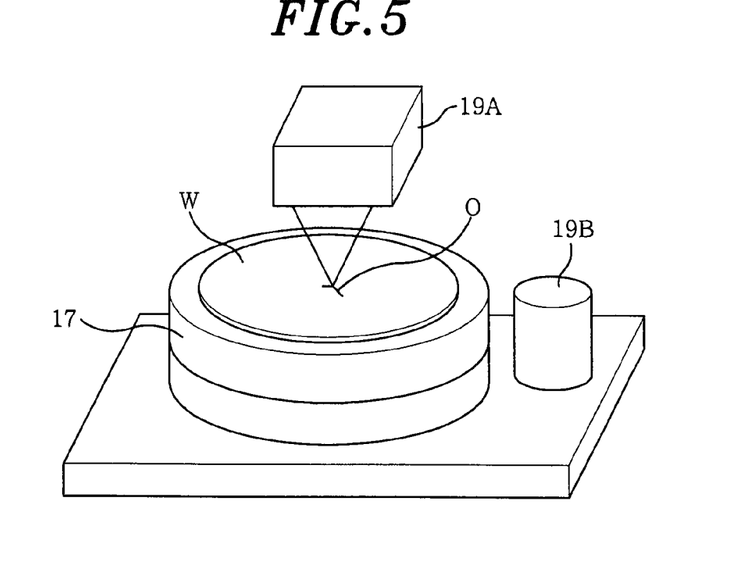
FIG. 5 represents a perspective view showing how foreign materials on a top surface of a polishing wafer shown in FIG. 4 are detected.

In step S3, it is determined whether or not the unload stop function is executed. When the unload stop function is executed, the first camera 19A of the alignment mechanism 19 moves to the probe center. While the mounting table 17 is moving directly below the first camera 19A, the top surface of the polishing wafer W' is scanned by the first camera 19A, and every part of the top surface of the polishing wafer W' is image-picked up by the first camera 19A as shown in FIG. 5 (step S4). The presence of the foreign materials O on the polishing wafer W' is determined by the above image pick-up process (step S5).

If it is determined that the foreign materials O exist on the polishing wafer W' as shown in FIG. 5, the polishing wafer W' on the mounting table 17 is transferred and received into the wafer table 21 by the wafer transfer mechanism 14 (step S6). At this time, the polishing wafer W' is detected by the optical sensor in the wafer table 21, and the operator is notified that the polishing wafer W' having foreign materials O is received in the wafer table 21 (step S7). At the same time, the first camera 19A moves from the probe center to the original place.

The operator pulls the wafer table 21 out and takes the polishing wafer W' out of the wafer table 21, so that the foreign materials O are removed by cleaning or the like (step S8). Thereafter, the operator returns the polishing wafer W' to the wafer table 21, and the wafer transfer mechanism 14 is driven so that the polishing wafer W' is transferred from the wafer table 21 and received into the buffer table 20 (step S9), thereby completing a series of probes polishing operations.

Further, after the probes 18A of the probe card 18 are polished in step S2, if it is determined in step S3 that the unload stop function will not be executed, the process proceeds to step S9. Next, the polishing wafer W' is returned from the mounting table 17 to the original place in the buffer table 20 by using the wafer transfer mechanism 14 (step S9), thereby completing a series of the probe polishing operations.

As described above, the method of the present embodiment includes the steps of: a first step of transferring the polishing wafer W' from the buffer table 20 to the mounting table 17; a second step of detecting foreign materials O on a top surface of the polishing wafer W' mounted on the mounting table 17; a third step of transferring the polishing wafer W' from the mounting table 17 to the wafer table 21; a fourth step of unloading the polishing wafer W' from the wafer table 21 and removing the foreign materials O from the polishing wafer W'; and a fifth step of transferring the polishing wafer W' from which the foreign materials O are removed from the wafer table 21 to the buffer table 20.

Accordingly, it is possible to automatically detect the foreign materials O on the top surface of the polishing wafer W' and remove the foreign materials O therefrom. For that reason, a next polishing operation can be securely performed without damaging the probes 18A by using the clean polishing wafer W'. Further, upon completion of the polishing of the probes 18A, the electrical characteristics of a next semiconductor wafer W can also be securely inspected with no difficulty. By performing the second to the fifth steps after polishing the probes 18A, the loading and unloading of the polishing wafer W' with respect to the mounting table 17 from the buffer table 20 can be completed in a single series of processes.

Besides, in accordance with the present embodiment, when no foreign materials O are detected on the top surface of the polishing wafer W', a step of transferring the polishing wafer W' from the mounting table 17 to the buffer table 20 is performed. Hence, the electrical characteristics of the semiconductor wafer W can be inspected with no difficulty.

Furthermore, in accordance with the present embodiment, when the foreign materials O are detected on the top surface of the polishing wafer W', it is notified to the operator that the foreign materials O exist on the polishing wafer W'. Immediately after the notification, the operator can unload the polishing wafer W' from the wafer table 21 and remove the foreign materials O from the polishing wafer W'. Accordingly, the inspection for electrical characteristics of the semiconductor wafer W can be restarted in a short period of time.

In addition, in the present embodiment, an optical sensor is used as a unit for detecting the polishing wafer W' in the buffer table 20 and the wafer table 21. However, another sensor such as a contact-type sensor or the like may be properly selected and used instead of the optical sensor. Further, in the present embodiment, the conventional buffer table 20 and wafer table 21 are used as a place for receiving the polishing wafer W'. However, a separate receiving part can also be provided.

The present invention can be suitably used for cleaning probes of a probe card used in a probe apparatus.

While the invention has been shown and described with respect to the embodiments, it will be understood by those skilled in the art that various changes and modification may be made without departing from the scope of the invention as defined in the following claims.

What is claimed is:
1. A probe polishing method for polishing probes by bringing a polishing member into slide-contact with the probes through a mounting table having thereon the polishing member transferred from a first receiving part, the probe polishing method comprising:
transferring the polishing member from the first receiving part of a loader chamber to the mounting table of a prober chamber by a wafer transfer mechanism;
detecting a presence of foreign materials on a top surface of the polishing member mounted on the mounting table;

transferring the polishing member by the wafer transfer mechanism from the mounting table to a second receiving part of the loader chamber when the foreign materials are detected on the top surface of the polishing member;

using an optical sensor to identify that the polishing member with the foreign materials is received on the second receiving part;

unloading the polishing member from the second receiving part by an operator to remove the foreign materials on the polishing member;

returning the polishing member to the second receiving part by the operator; and transferring the polishing member from which the foreign materials are removed from the second receiving part to the first receiving part by the transfer wafer mechanism.

2. The probe polishing method of claim 1, further comprising polishing the probes by bringing the polishing member mounted on the mounting table into slide-contact with the probes between said transferring the polishing member from the first receiving part to the mounting table and said detecting a presence of the foreign materials.

3. The probe polishing method of claim 2, wherein said detecting a presence of the foreign materials is performed without removing the polishing member from the mounting table after said polishing the probes is performed.

4. The probe polishing method of claim 1, wherein when no foreign materials are detected on the top surface of the polishing member in said detecting the presence of the foreign materials, the polishing member is transferred back from the mounting table to the first receiving part.

5. The method for polishing probes of claim 1, wherein when the foreign materials are detected on the top surface of the polishing member in said detecting the presence of the foreign material, the second receiving part is notified to the presence of the foreign materials.

6. A probe polishing program stored on a non-transitory computer readable medium for driving a computer to perform a probe polishing method for polishing probes by bringing a polishing member into slide-contact with the probes via a mounting table having thereon the polishing member transferred from a first receiving part, wherein the program, when executed on the computer, performs:

transferring the polishing member from the first receiving part of a loader chamber to the mounting table of a prober chamber by a wafer transfer mechanism;

detecting a presence of foreign materials on a top surface of the polishing member mounted on the mounting table;

transferring the polishing member by the wafer transfer mechanism from the mounting table to a second receiving part of the loader chamber when the foreign materials are detected on the top surface of the polishing member;

using an optical sensor to identify that the polishing member with the foreign materials is received on the second receiving part;

unloading the polishing member from the second receiving part by an operator to remove the foreign materials on the polishing member;

returning the polishing member to the second receiving part by the operator; and transferring the polishing member from which the foreign materials are removed from the second receiving part to the first receiving part by the transfer wafer mechanism.

7. The probe polishing program of claim 6, wherein when no foreign materials are detected on the top surface of the polishing member in said detecting the presence of foreign materials, the program performs transferring the polishing member from the mounting table to the first receiving part.

8. The probe polishing program of claim 6, wherein when the foreign materials are detected on the top surface of the polishing member in said detecting the presence of foreign materials, the second receiving part is notified to the presence of the foreign materials.

* * * * *